United States Patent
Sprenger

(10) Patent No.: US 9,797,700 B2
(45) Date of Patent: Oct. 24, 2017

(54) VARIABLE MODELLING OF A MEASURING DEVICE

(71) Applicant: Hexagon Technology Center GmbH, Heerbrugg (CH)

(72) Inventor: Bernhard Sprenger, Widnau (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 744 days.

(21) Appl. No.: 14/172,749

(22) Filed: Feb. 4, 2014

(65) Prior Publication Data

US 2014/0222372 A1    Aug. 7, 2014

(30) Foreign Application Priority Data

Feb. 5, 2013    (EP) .................................... 13153954

(51) Int. Cl.
*G01B 21/00*    (2006.01)
*G01B 5/008*    (2006.01)
(Continued)

(52) U.S. Cl.
CPC ........... *G01B 5/008* (2013.01); *G01B 21/045* (2013.01); *G05B 17/02* (2013.01); *G05B 19/404* (2013.01); *G06F 17/5018* (2013.01)

(58) Field of Classification Search
CPC .... G01B 5/008; G01B 21/045; G01B 11/002; G05B 2219/37193; G05B 2219/49181; G06F 17/5018; G01C 15/002
See application file for complete search history.

(56) References Cited

U.S. PATENT DOCUMENTS 6,546,643 B2    4/2003  Lotze et al.
6,615,112 B1 *  9/2003  Roos ...................... B25J 9/1692
                                                          318/568.1
(Continued)

FOREIGN PATENT DOCUMENTS

CN    101706841 A    5/2010
DE    102 14 489 A1   10/2003
(Continued)

OTHER PUBLICATIONS

European Search Report and Written Opinion dated Jul. 3, 2013 as received in Application No. EP 13 15 3954.
(Continued)

*Primary Examiner* — Elias Desta
(74) *Attorney, Agent, or Firm* — Maschoff Brennan

(57) ABSTRACT

A method for providing static and dynamic position information of a designated point of a measuring device having a surface and a structure that includes the designated point and being arranged moveable relatively to the surface. The method includes defining a model for representing an actual position of the designated point relative to the surface and deriving the actual position of the designated point by a calculation based on the defined model. At least two cells are used to model the structure. The at least two cells are linearly arranged in a linear extension direction. At least one of the cells is a variable cell of a set of at least one variable cell and exhibits variable elongation as to the extension direction. An actual elongation of the at least one variable cell is set to model a positional change, particularly in linear extension direction, of the designated point.

21 Claims, 5 Drawing Sheets

(51) Int. Cl.
    *G01B 21/04*     (2006.01)
    *G06F 17/50*     (2006.01)
    *G05B 17/02*     (2006.01)
    *G05B 19/404*     (2006.01)

(56) References Cited

U.S. PATENT DOCUMENTS

| | | | |
|---|---|---|---|
| 7,395,606 B2 * | 7/2008 | Crampton | B25J 13/088 33/503 |
| 8,798,794 B2 * | 8/2014 | Walser | B25J 9/1697 382/103 |
| 2007/0239409 A1 | 10/2007 | Alan | |

FOREIGN PATENT DOCUMENTS

| | | |
|---|---|---|
| EP | 1 559 990 A2 | 8/2005 |
| EP | 1 687 589 B1 | 9/2012 |
| GB | 2 425 840 A | 11/2006 |
| JP | 2005-305584 A | 11/2005 |
| WO | 02/04883 A1 | 1/2002 |

OTHER PUBLICATIONS

"Finite Element Procedures", K. J. Bathe, Prentice Hall, 2nd edition, Jun. 26, 1995, pp. 1-11.

\* cited by examiner

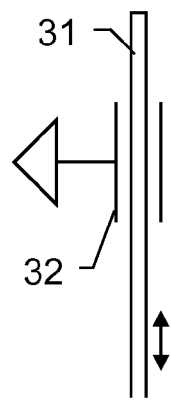
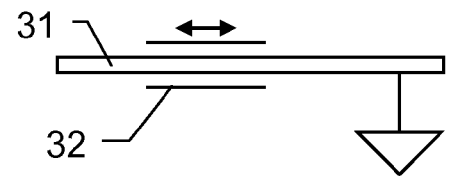
Fig.1a   Fig.1b
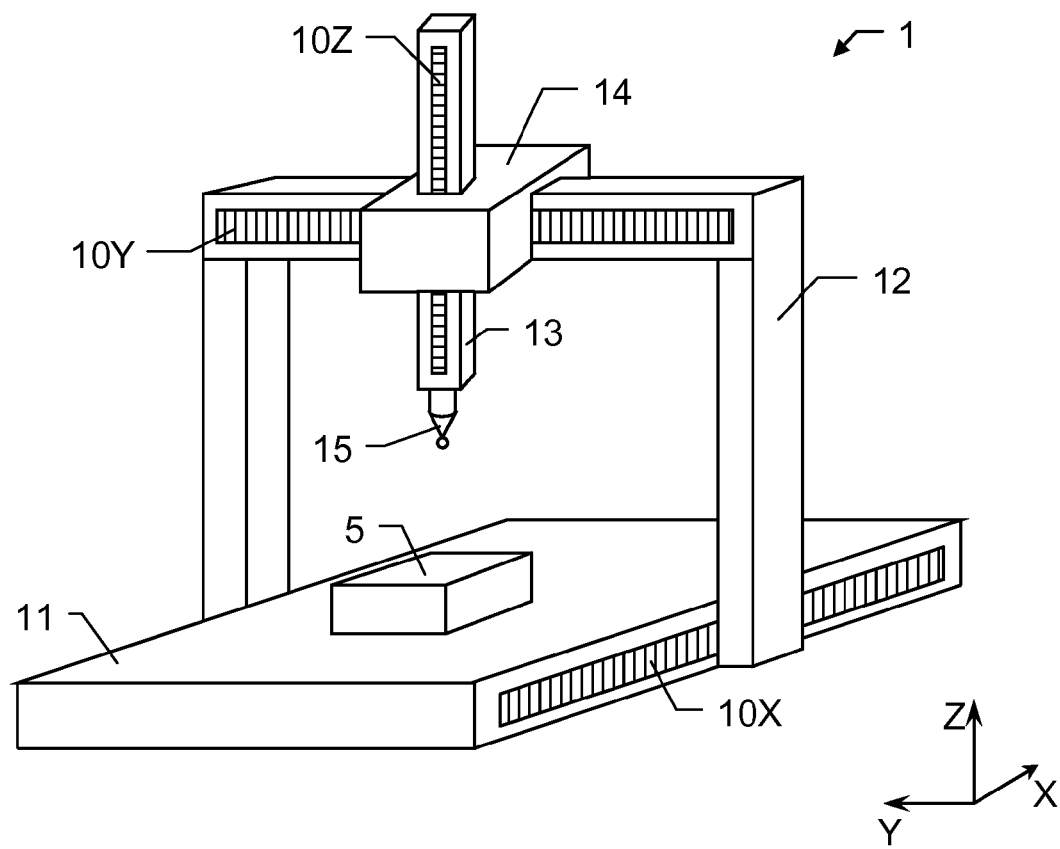
Fig.2

VARIABLE MODELLING OF A MEASURING DEVICE

FIELD OF THE INVENTION

The present invention generally pertains to a method for modelling a position of a designated point of a measuring device and to a measuring device being adapted for execution of such method.

BACKGROUND

In context with the present invention reference is made to measuring devices providing positioning ability of at least one machine component relative to one or more other machine parts (e.g. a base of the device). Such measuring device for instance is a robotic device for manipulating and/or for measuring work pieces or a coordinate measuring apparatus for inspecting work pieces.

It is common practice to inspect work pieces subsequent to production on a coordinate positioning apparatus, such as a coordinate measuring machine (CMM), in order to check for correctness of predefined object parameters, like dimensions and shape of the object.

In a conventional 3-D coordinate measurement machines, a probe head is supported for movement along three mutually perpendicular axes (in directions X, Y and Z). Thereby, the probe head can be guided to any arbitrary point in space of a measuring volume of the coordinate measuring machine and the object is measurable with a measurement sensor (probe) carried by the probe head.

In a simple form of the machine a suitable transducer mounted parallel to each axis is able to determine the position of the probe head relative to a base of the machine and, therefore, to determine the coordinates of a measurement point on the object being approached by the sensor. For providing movability of the probe head a typical coordinate measuring machine may comprise a frame structure on which the probe head is arranged and driving means for moving frame components of the frame structure relative to each other.

For measuring surface variations, both measurement principles based on use of tactile sensors and of optical sensors are known.

In general, to provide a coordinate measuring machine with an improved measurement precision, its frame structure is therefore usually designed to have a high static stiffness. In order to achieve a stiff and rigid machine design, the frame structure or at least parts of it, is often made of stone, such as granite. Besides all the positive effects like thermal stability and good damping properties, the granite also makes the machine and the movable frame elements quite heavy. The high weight on the other side also requires high forces for a decent acceleration.

There are still several possible sources of error, if such technique is employed. Resonances or vibrations of machine parts when moving one frame component relative to another component are just two examples for dynamic errors. Additionally, static errors like lack of straightness in movement and of orthogonality of the axes or lateral offset in the linear drive mechanisms may occur.

According to many approaches the mentioned errors are only analyzed statically, although they also comprise dynamic factors which are dependent on the movement of the axes, in particular dependent on the position, speed, acceleration and jerk when moving the axis. With the speed-dependent calibration, this fact is taken into account in a rather simple and inflexible way. While the static errors can be numerically reduced by the use of position calibration matrices, things get much more complex when trying to compensate the dynamic errors.

The calibration gets even more complex when taking into account the dynamic errors, such as mentioned vibrations or resonance or dynamic forces etc. which errors can not only influence the axis on which they are occurring, but which can also "crosstalk" to other axes and cause errors in other parts of the system. Furthermore, the underlying effects can also be dependent on environmental conditions such as temperature, humidity, air-pressure, etc. and in particular, they will also vary over the lifetime of the machine.

In that context, for example, it has to be considered that accelerations of one axis of the machine (which can move further perpendicular axes and the probe head), can cause linear and angular dynamic deflections of the whole frame of the coordinate measuring machine, which in turn cause measurement uncertainties and errors. These dynamic measurement errors may be reduced by taking measurements at low accelerations, e.g. by a consequently optimized trajectory of desired movement.

Known approaches are trying to suppress deflections, vibrations and/or oscillations caused by the acceleration of the machine by a technology called input-shaping, which controls the regulating variable, e.g. the force or current of a propulsion motor, in such a way as to bypass mechanical resonances and avoid a stimulation of resonance frequencies or even actively counterforce oscillations by a accordingly manipulated variable on the output to the driving actuator control.

Also model predictive control, as a form of control in which the current control action is obtained by solving at each sampling instant a finite horizon open-loop optimal control problem, using the current state of the plant as the initial state, can be applied to CMMs. The optimisation yields an optimal control sequence and the first control in the sequence is then applied to the plant.

Exemplarily for error handling, EP 1 559 990 discloses a coordinate measuring system and method of correcting coordinates measured in a coordinate measuring machine, measuring geometrical errors while parts with various weights are mounted on the coordinate measuring machine. Compensation parameters are derived from measured results per a weight of a part and stored. A compensation parameter corresponding to a weight of a part to be measured is appropriately read out to correct measured coordinates of the part to be measured.

As a further example, EP 1 687 589 discloses a method of error compensation in a coordinate measuring machine with an articulating probe head having a surface detecting device. The surface detecting device is rotated about at least one axis of the articulating probe head during measurement. The method comprises the steps of: determining the stiffness of the whole or part of the apparatus, determining one or more factors which relate to the load applied by the articulating probe head at any particular instant, and determining the measurement error at the surface sensing device caused by the load.

Another approach for error correction of work piece measurements with a coordinate measuring machine (CMM) is disclosed in GB 2 425 840. Thereby, position measurements are taken with a work piece sensing probe, in which means of measuring acceleration are provided. The measurements are corrected for both high frequency (unrepeatable) errors such as those due to vibration, and low frequency (repeatable) errors such as those due to centrifugal forces on the probe. The correction method comprises measuring the work piece, determining repeatable measurement errors from a predetermined error function, error map or error look-up table, measuring acceleration and calculating unrepeatable measurement errors, combining the first and second measurement errors to determine total errors and correcting the work piece measurements using the total errors. The predetermined error map is calculated using an artefact of known dimensions.

It is also known to use accelerometers fitted in the probe or on other moving parts of the measurement machine, e.g. the Z-column and/or in the base table, allowing a differential measurement and/or the evaluation of externally applied vibrations. In such an arrangement, the displacements and errors of the probe-position can be measured with double integration, and based on this information it is possible to adjust the reading with the difference between the doubly integrated signal and the scales. For instance, such an approach is disclosed by WO 02/04883.

For handling above mentioned errors, in particular dynamic errors, usually a suitable model of the CMM is defined, wherein a positioning behavior of especially the frame structure of the CMM is enabled to be described based on that model. Exemplarily, a look-up table may be defined in order to lookup a correction value correlated with an actual positioning of the frame components of the CMM. Such modelling of a CMM becomes more important along with weight (and stiffness) reduction of CMM-parts.

Alternatively or in addition to a look-up table, the use of a quasi static model with modelled static elasticity is known, wherein e.g. the Z-column is implemented as one single beam represented by a static generated mesh. Here, bearing forces move over the borders of several finite elements which leads to sudden changes in the modeled system excitation and, consequently, to inaccuracies. Such inaccuracies can be overcome by applying a weighted force distribution over several discrete elements to the model. This leads to a large number of finite elements to be used and, thus, disadvantagly, to high requirements for computing power and to very time consuming calculating processes. General approaches for such modeling of solid structures are described in detail e.g. in "Finite Element Procedures", K. J. Bathe, Prentice Hall, $2^{nd}$ edition, 26 Jun. 1995 or in "Nichtlineare Finte-Elemente-Methoden", Peter Wriggers, $1^{st}$ edition, 13 Jun. 2008.

SUMMARY

It is therefore an object of the present invention to provide an improved and simplified method for providing positioning information of a structure relative to a further structure, in particular a positioning behaviour of a designated point of the structure.

A further object of the invention is to model specific positioning of CMM parts relative to each other with high accuracy and low calculation effort.

A further object of the invention is to provide a model providing dynamic and elastic properties of a point of a measuring device, in particular of a CMM, wherein calculation of the model is little time consuming and with high accuracy.

Yet another object of the invention is to provide an improved coordinate measuring machine (CMM) performing measuring tasks and determining coordinates of a measurement point by processing model parameters correlated to a measuring position of a CMM structure.

The general idea of the present invention is to provide a modelling approach for a measuring device providing a fast and precise calculation of a state of the device. The present approach is based on the use of at least one finite element being variable in its elongation as to an extension direction of the element. The extension direction of the element typically represents an extension direction of the corresponding structural component which is modelled with that element. By changing (basically only) the elongation of the element the model and computing time for recalculating the state can be improved. Moreover, such approach enables to use quite a small number of elongated elements for describing a machine component and a current position of the component.

The invention relates to a method for providing static and dynamic position information of a designated point of a measuring device, the measuring device comprising a surface and a structure comprising the designated point and being arranged moveable relatively to the surface. Furthermore, defining a model for representing an actual position of the designated point of the structure relative to the surface and deriving the actual position of the designated point by a calculation based on the defined model is performed with view to the method.

According to the invention, the model comprises at least two cells for modelling the structure, wherein the at least two cells for modelling the structure are linearly arranged in a linear extension direction (in particular wherein the linear extension direction is defined by an elongation of at least one of the cells for modelling the structure), at least one of the cells for modelling the structure is a variable cell of a set of at least one variable cell and the at least one variable cell having variable elongation as to the linear extension direction. In order to model a positional change, particularly in the linear extension direction, of the designated point an actual elongation of the at least one variable cell is set.

Such definition of the model for deriving the position of the designated point enables to simply model a positional change of this point, e.g. by only changing the elongation of at least one variable cell. In particular, the linear extension direction is defined by an elongation at least one variable cell. Based on the change of only that elongation a new position of the designated point can be calculated with low effort, as the essential change in the model is caused by the elongation change and further model parameters basically may remain unchanged.

The cell for modelling the structure represents a modelled element defined by parameters, e.g. elongation, mass and/or stiffness, for describing a state of at least a part the measuring device. Computing or calculating of that state is provided on basis of the cell and its properties. Thus, in particular, the cell is not to be understood as a structural component of a device, but has to be seen as an implemented (virtual) element for describing and calculating a state of the device.

With changing the elongation of a cell in the model the mass of the respective cell changes accordingly, i.e. if the elongation of a cell is increased the defined mass for the cell increases as well.

In context with the present invention it is to be understood, that the linear extension direction defined by a cell or by the arrangement of at least the two cells for modelling the structure also includes extensions being basically linear and for instance comprising slight curvature which may be caused by forces applied with touching an object with a probe of the measuring device. Thus, structures with a displacement relative to a centre axis of about 1-5 mm with respect to an extension of the structure as to the centre axis of 1-2 meters are to be understood as linear extending structures.

According to a specific embodiment of the invention the model comprises at least two variable cells being linearly arranged as to the linear extension direction, wherein the positional change of the designated point is modelled by setting an actual elongation of the at least two variable cells.

A further embodiment of the invention relates to a specific design of the model. The model additionally comprises a set of at least one static cell for modelling the structure, wherein at least one of the cells for modelling the structure is a static cell of the set of at least one static cell, the at least one static cell and the at least one variable cell are linearly arranged in the linear extension direction and the at least one static cell has constant elongation as to the extension direction.

The basic idea of this embodiment of the invention is to represent at least a part of a structure of a device by quite a small number of implemented cells, wherein a first group of cells comprises static cells of constant elongation and a second group of implemented cells comprises cells with variable elongation. A positional change of structural elements relative to each other is modelled by changing the elongation of at least one variable cell at to the extension direction, which is defined by a linear arrangement of the cells. With such modelling of the device structure a positional change of the structure is enabled to be calculated by variations of the model parameters, in particular of the variable cell parameters only, and recalculating a relative positioning of structural elements by executing a predefined mathematical algorithm. With that calculation, the static cells are basically handled in always the same manner, wherein the variations in the calculations are mainly generated by varying parameters for the variable cells.

By holding the elongation of the static cells constant, i.e. keeping the model parameters for the static cells (e.g. elongation and/or stiffness), the recalculation for representing a new positioning of the structure is performed with relative low effort and little computation time (as the changes in the structure emerge from variations of the variable cells only).

According to a further specific embodiment of the invention, at least one of the cells for modelling the structure is implemented as an interconnecting cell for modelling interactions between the designated point of the structure and the surface, wherein the interconnecting cell is allocated to the surface and remains allocated to the surface when modelling the positional change of the designated point. More specifically, the interconnecting cell may be implemented with constant position relative to the surface and/or the positional change may be modelled by varying the elongation of at least two variable cells.

Moreover, still regarding the modelling of the structure for proving a positional information of the designated point, according to a further embodiment of the invention a first, a centre and a last cell are implemented, wherein the centre cell belongs to the set of at least one variable cell or to the set of at least one static cell and is implemented for modelling interactions between the surface and the structure and the first and the last cell belong to the set of at least one variable cell and the positional change of the designated point is modelled by changing the elongation of the first and the last cell.

Such construction of the model can provide describing an interaction between the structure and the surface by a fixed element (variable or static cell) and, thus, simplifies the model for consideration e.g. of interacting forces. Additionally, such interaction may be correlated to the centre cell (which may be defined in fixed position and fixed or variable elongation) and the positional change of the structure or the designated point is modelled by changing the elongation of two further variable cells.

Referring to proving of positional information of the designated point, according to a specific embodiment of the invention, an updated actual position of the designated point is provided by recalculating the position of the designated point with updated elongation parameters of the model, wherein the elongation parameters represent the actual elongation of the at least on variable cell and are updated with changing (setting) the elongation. In particular, the updated actual position is provided with a defined time interval, in particular continuously by continuously recalculating the position of the designated point.

By performing the calculation process in a continuous manner a tracking of the position of the designated point is possible and the position is derived continuously as well.

Furthermore, according to the invention, an actual position information for at least a part of the measuring device is derived by calculation based on the model, in particular a spatial coordinate of a measurement point measurable by a probe connected to the structure is derived. Therefore, the model enables to precisely determining a position of a point on a surface of an object to be measured.

Additionally or alternatively, cell parameters are defined by the model according to the invention at least defining one of the following properties of static and/or variable cells for reproducing realistic properties of the structure:
length,
stiffness,
mass,
inertia and/or
thermal characteristic.

With help of these cell parameters the properties of each single cell can be adapted according to the properties of the modelled structure. For instance, each cell—especially the variable cells—or groups of cells may be defined with different properties regarding their masses or stiffness characteristic.

Moreover, according to the invention a state parameter indicating a dynamic behaviour of the structure and/or of the designated point is derived (e.g. with predetermined time steps), in particular wherein the state parameter depends on the position of the designated point relative to the surface and/or on a positional change of the designated point and/or of the surface.

The state parameter defines—according to a further embodiment of the invention—one at least of the following values and/or a change of the respective value for the structure and/or the designated point:
actual velocity,
actual acceleration, in particular rotational acceleration,
currently occurring force, in particular touching force occurring by contacting an object with the probe,
currently occurring torque and/or
currently occurring mechanical stress.

Therefore, the model enables also to describe a dynamic movement and/or a vibration of the structure (the designated point, respectively) and may give information at any particular instant about occurring force and/or occurring torque and/or mechanical stress. Furthermore, information about deformations caused e.g. by applied forces is derivable on basis of the model.

According to a further specific embodiment of the invention, an error value representing a displacement and/or deflection of at least a part of the structure is derived, in particular of the designated point, wherein the displacement and/or deflection is caused by vibration, bending and/or torsion of at least a part of the structure and/or of the surface, in particular wherein the error value is derived depending on the cell parameters and the state parameter, in particular wherein the error value is processed for determining a compensated spatial coordinate of a measurement point. Thus the method according to the invention enables to provide information about occurring errors at any particular instant and provides to compensate for the determined errors.

Concerning one more aspect of modelling the structure, according to the invention connection units are defined for modelling a connection of two neighboring cells, wherein the connection units are providing damping and/or spring properties, and/or the surface is embodied by a bearing or a carriage, in particular by an air bearing.

Relating to structural embodiments of the measuring device, the measuring device—according to a specific embodiment of the invention—is formed as a coordinate measuring machine, as a geodetic device, in particular total station, theodolit or tachymeter, as a laser tracker or as a laser rotator, in particular according to an embodiment as described with embodiments of the measuring device according to the invention below.

The invention relates also to a measuring device comprising a structure and a surface, which are arranged movable relatively to each other, driving means allocated to the structure and the surface for providing movability and a controlling and processing unit adapted for execution of a modelling functionality, on execution of which a model for representing an actual position of a designated point of the structure relative to the surface is defined and the designated point of the structure is derived by a calculation based on the defined model.

The model comprises at least two cells for modelling the structure, wherein the at least two cells for modelling the structure are linearly arranged in a linear extension direction, at least one of the cells for modelling the structure is a variable cell of a set of at least one variable cell and the at least one variable cell having variable elongation as to the extension direction. On execution of the modelling functionality an actual elongation of the at least one variable cell is set in order to model a positional change, particularly in linear extension direction, of the designated point and the actual position of the designated point is calculated based on the model using actual elongation of the at least one variable cell.

According to the invention the measuring device may be formed as a coordinate measuring machine, as a geodetic device, in particular total station, theodolit or tachymeter, as a laser tracker or as a laser rotator.

In particular the coordinate measuring machine comprises the structure being represented by a first of a number of structural components of the coordinate measuring machine, comprises the surface being represented by a second of the number of structural components, in particular of by a carriage, or by a base for receiving an object to be measured by the coordinate measuring machine, and comprises a probe head being movable in at least one direction, in particular in three directions being perpendicular to each other, by a machine structure provided by the number of structural components.

Particularly, the geodetic device or the laser tracker comprises the surface being represented by at least a part of a device base, which defines a first axis of rotation, or by at least a part of a support unit defining a second axis of rotation and carrying an aiming unit for directing a leaser beam to a target, in particular a telescope, the support unit being arranged rotatable around the first axis of rotation and the aiming unit being arranged rotatable around the second axis of rotation, and comprises the structure being represented by at least a part of the aiming unit or by at least a part of the support unit.

The laser rotator particularly comprises the surface being represented by at least a part of a directing unit for aligning a rotation axis of a deflection unit and the structure being represented by at least a part of the deflection unit.

Furthermore, in context with a specific embodiment of the invention, the controlling and processing unit is adapted for execution of a method for providing static and dynamic position information of a designated point of a measuring device according to the invention, particularly according to one of the claims 1-10.

Moreover, the invention relates to a computer programme product having computer-executable instructions for performing the method for providing static and dynamic position information of a designated point of a measuring device according to the invention, in particular when run on a controlling and processing unit of a measuring device according to the invention.

The method and the device according to the invention are described or explained in more detail below, purely by way of example, with reference to working examples shown schematically in the drawings. Specifically,

BRIEF DESCRIPTION OF THE DRAWINGS

FIGS. 1*a-b* illustrate a structure and a surface which are moveable relative to each other;

FIG. 2 shows a first exemplary embodiment of a coordinate measuring machine according to the invention;

DETAILED DESCRIPTION

Figure 3:
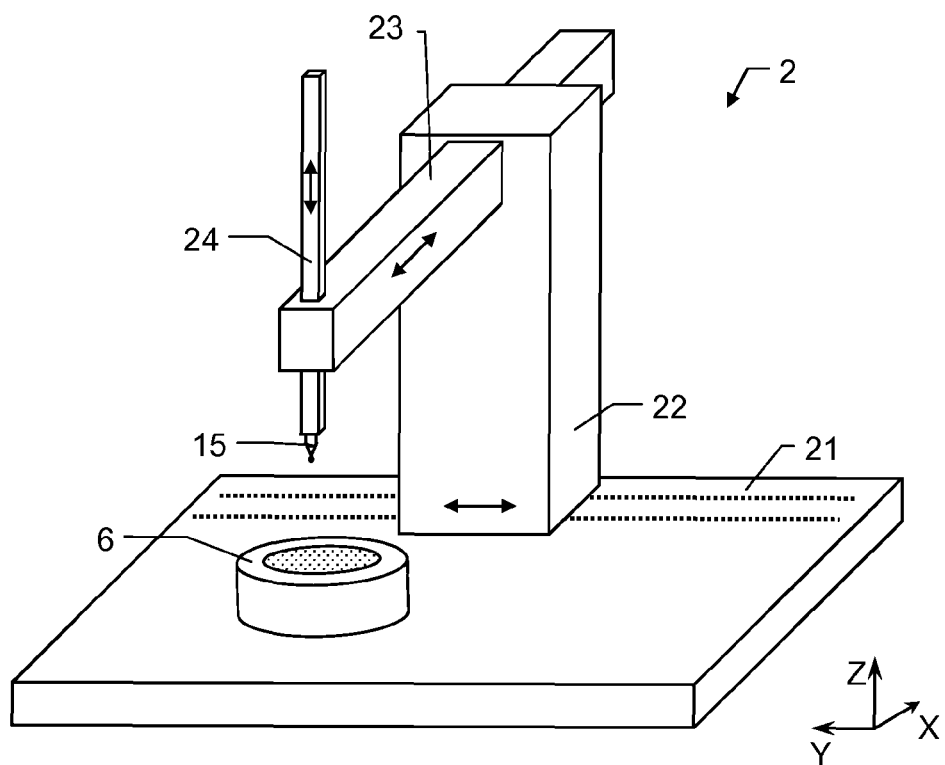
FIG. 3 shows a second exemplary embodiment of a coordinate measuring machine according to the invention.

FIG. 1*a* and FIG. 1*b* each illustrate a structure 31 and a surface 32, wherein the two elements 31, 32 (structure 31 and surface 32) are arranged so that they are moveable at least parallel to each other. Such movability may be provided by a linear drive mechanism (not shown), wherein a linear guide of the drive mechanism is arranged at the surface 32 or at the structure 31.

FIG. 1*a* shows an arrangement of the structure 31 and the surface 32, wherein the structure 31 is movable relative to the surface 32 and the surface 32 forms a positionally fixed reference element regarding the movement of the structure 31. Such arrangement e.g. is realised with Z-rams (Z-column, sleeve) of CMMs. There, the Z-ram represents the structure 31 and moves—for measuring a measurement point on an object to be measured—relative to a bridge (portal CMM) or relative to a carriage which is driven on the bridge.

FIG. 1*b* shows an alternative arrangement of the structure 31 and the surface 32, wherein the structure 31 is positioned fixedly and the surface 32 is arranged to provide movability relative to the structure 31. Such arrangement e.g. is realised with Y-carriages or—generally—for providing movability of one frame component relative to a second frame component e.g. in Y-direction.

The surface 32 does not need to be a physical plane but may be represented by a number of (guide) bearings which define a guiding direction or moving direction for the surface 31.

Exemplarily, positioning and movability of a structure 31 relative to a surface 32 is illustrated in context with FIGS. 2 and 3, wherein CMMs with machine components being arranged movable relative to each other are shown.

According to the invention, a modelling of the structure 31 is realised by a linear arrangement of at least one elongated cell being variable regarding its elongation as to an extension direction and—according to a specific embodiments of the invention—additional static cells in order to represent an actual position of the structure 31 relative to the surface 32. Further, a positional change of the structure 31 relative to the surface 32 is modelled by adjusting elongation of the at least one variable cell. In more detail, features and principles for such modelling are described as set forth below with FIGS. 4a-f.

In FIG. 2 an exemplary embodiment of a portal coordinate measuring machine 1 (CMM) according to the invention is depicted, the coordinate measuring machine 1 comprises a base 11 and a frame structure for linking a probe head 15 to the base 11, the frame structure comprising several frame components 12,13 being movable with respect to another. The first frame component 12 is a portal having two portal legs, which are connected by a bridging portion at their upper ends. Driven by a drive mechanism (not shown), the frame component 12 is capable to move along the longitudinal sides of the base 11. This direction corresponds to a first direction X. The movement of the frame component 12 particularly is performed by a gear rack attached to the base 11, which is meshing with a pinion on the frame component 12.

A carriage 14 is movably arranged on the bridging portion of the frame component 12. The movement of the carriage 14 (which is to be seen as a further frame component) may also be achieved by a rack and pinion. A vertical rod 13 (sleeve, Z-ram), building a further frame component, is movably incorporated into the carriage 14. At the bottom portion of the vertical rod 13 a probe head 15 is provided.

In context with the present invention, generally, the surface relative to which the structure is moveable (or vice versa) may be represented by the carriage or by one of the other frame components (e.g. the bridging portion) and the structure may be represented by the Z-ram or the bridging portion.

The probe head 15 is movable to any desired point in a measuring volume (work zone) of the coordinate measuring machine 1 in the directions X, Y and Z. The measuring volume is defined by the base 11 and the frame components 12,13 and in particular by the range of movability of the carriage 14. The three space directions X, Y and Z are preferably orthogonal to one another, although this is not necessary for the present invention. It should be noted that a drive mechanism and a controller for driving the frame components and, thus, for driving the probe head 15 are not shown.

An object 5 to be measured is positioned in the space of the measuring volume on the base 11.

The probe head 15, on which a stylus is arranged exemplarily, is fastened on the lower free end of the rod 13. The stylus is used in a manner known per se for touching the object 5 to be measured. However, the present invention is not restricted to a tactile coordinate measuring machine and may likewise be used for coordinate measuring machines in which a measurement point is approached in a non-contact manner, i.e. for example a coordinate measuring machine with an optical scanning head. More generally, the probe head 15 may be designed for arranging a contact probe, e.g. a scanning or touch trigger probe, or a non-contact probe, particularly an optical, capacitance or inductance probe, or an articulated probe.

Two of the most common types of bearings between the movable members and the guides are air bearings or ball bearings (e.g. linear circulating plus rails). The air bearings give the advantage that there is no friction in the movement (which may introduce different kind of errors like angle errors or hysteresis). The disadvantage of air bearings is that the stiffness is lower than in ball bearings, so that particularly dynamic errors may occur. In ball bearing types, the stiffness in the bearing system is typically higher but there is friction and the friction forces may introduce errors. However, the invention may be applied for both types of bearings or similar approaches.

Summed up, the coordinate measuring machine 1 is built for determination of three space coordinates of a measurement point on an object 5 to be measured and, therefore, comprises three linear drive mechanisms for provision of movability of the probe head 15 relative to the base 11 in the first, second and third direction (X, Y and Z direction) and particularly machine components providing additional rotatory degrees of freedom (e.g. articulated probe).

Each linear drive mechanism has a linear guide, one in the first, one in the second and one in the third direction (X, Y and Z direction), respectively. In a simple embodiment, the linear guide of the X-direction drive mechanism is formed by two or three edge-building surfaces of the base 11, the linear guide of the Y-direction drive mechanism is formed by two or three surfaces of the bridge and the linear guide of the Z-direction drive mechanism is formed by a cubical hole in the Y-carriage member.

Furthermore, each linear drive mechanism comprises a movable member being supported for movement along the guide by bearings. In particular, the movable member of the X-direction drive mechanism is embodied as X-carriage having mutually facing surfaces with respect to the above mentioned two or three guiding surfaces of the base 11. The movable member of the Y-direction drive mechanism is embodied as Y-carriage 14 having mutually facing surfaces with respect to the above mentioned two or three guiding surfaces of the bridge. And, the movable member of the Z-direction drive mechanism is formed by Z-column 13 (sleeve) having mutually facing surfaces with respect to the inner surfaces of the cubical hole in the Y-carriage.

Moreover, each linear drive mechanism comprises a linear measuring instrument for determination of a first, a second or a third drive position, respectively, of each movable member in the first, the second or the third direction (X, Y and Z direction), respectively.

In this exemplary embodiment of FIG. 1, the portal legs each have a movable X-carriage which allows movement of the first frame component 12 in X-direction.

A measuring scale 10X being part of the X-measuring instrument is schematically represented on the long side of the base 11, wherein the scale 10X extends parallel to the X-direction. The scale may be a glass measuring scale, e.g. having incremental or absolute coding, with which a drive position in the X-direction of the X-carriage can be determined. It is to be understood that the measuring instrument may furthermore contain suitable sensors for reading the measuring scale 10X, although for the sake of simplicity these are not represented here. However, it should be pointed out that the invention is not restricted to the use of glass measuring scales, and therefore may also be used with other measuring instruments for recording the drive/travelling-positions of the movable members of the drive mechanisms.

Another measuring scale 10Y is arranged parallel to the Y-direction on the bridging portion of the first frame component 12. Finally, another measuring scale 10Z is also arranged parallel to the Z-direction on the Z-ram 14. By means of the measuring scales 10Y, 10Z as part of the linear measuring instruments, it is possible to record the present drive positions of the second frame member 14 in Y-direction and of the sleeve 13 in the Z-direction metrologically in a manner which is known per se.

In the shown embodiment, the base 11 comprises a table with a granite surface plate for supporting the object 5 to be measured, on which the space coordinates of the measurement point are intended to be determined.

Not shown is a controlling and processing unit, which is designed to actuate the motor drives of the coordinate measuring machine 1 so that the probe head 15 travels to the measurement point. The controlling and processing unit comprises a processor and a memory. In particular, the controlling and processing unit is designed for determining the three space-coordinates of the measurement point on the object 5 as a function of at least the first, the second and the third drive position of the three drive mechanisms.

For manual operation, the control unit may be connected to a user console. It is also possible for the control unit to fully automatically approach and measure measurement points of the object 5 to be measured.

Because the design of coordinate measuring machines of the generic kind as well as the design of different linear guides and different linear measuring instruments are well known to skilled persons, it must be understood that numerous modifications and combinations of different features can be made. All of these modifications lie within the scope of the invention.

Thus, the invention may generally be used with all types of coordinate measuring machines, i.e. with a CMM being designed as parallel kinematics machine as well as with a CMM having linear or serial kinematics. Exemplarily, the CMM may be designed as bridge-type, L-bridge-type, horizontal-arm-type, cantilever-type or gantry-type machine or may be designed as articulated arm. Furthermore, a measuring device in context with the present invention also is to be understood as a system for precise positioning and/or precise assembling of work pieces or tools and/or for applying materials, e.g. spraying or printing of paint or other materials. Such a system is designed to provide movement and measurement of positions within a working volume defined by the structure of the respective system and defines a coordinate system, within which positioning of system components with high precision is provided. In particular, such a system provides carrying and placing of a work piece or a tool relative to a further work piece with high accuracy. For instance, a robot providing precise positioning and/or measuring abilities may be operated and controlled based on execution of the model according to the invention.

Moreover, according to the invention, the controlling and processing unit comprises a functionality adapted to model a position and/or a movement of one frame component 12-14 relative to a further frame component 12-14 (which corresponds to the relative position and/or movement of a structure to a surface), in particular to model a position of a designated point of the CMM. For such modelling a suitable model is implemented representing one or one part of a frame component 12-14 by a discrete number of elements, wherein some of the elements are defined with elongated shape as to an extension direction (those elements are arranged linearly in that extension direction) and wherein interconnection elements between the single elements are defined providing e.g. damping and/or spring-like properties. At least some of those elements have variable elongation as to the extension direction.

A defined position of the modelled frame component 12-14 relative to a further frame component 12-14 is set by adjusting the elongation of at least one of the variable elements and, thus, modelling a positional change of the modelled frame component or the designated point, respectively, in one direction, i.e. the extension direction.

According to a specific modelling embodiment of the invention, the elements are divided into two groups of elements. A first group comprises static elements with constant elongation (in particular also with constant stiffness etc.) and a second group comprises elements with variable elongation.

The principle of modelling according to the invention is described in more detail in context with FIGS. 4a-f.

Above described functionality provides an improved basis for dynamically modelling machine parameters, in particular for determining and correcting or compensating errors, wherein by representing a frame component by a small number of elongated discrete elements therefore required calculation time for providing relative positioning and/or moving of the frame components remains low compared to other modelling approaches digitally describing CMM structures, e.g. by a dense mesh of finite elements. Moreover, as the modelling parameters of the static elements basically remain constant by modelling positional changes and because only a limited number of elements need to be used, computing time can be hold short.

FIG. 3 shows a second exemplary embodiment of a coordinate measuring machine 2 (CMM) according to the invention, wherein the coordinate measuring machine 2 comprises a base 21 and components 22, 23, 24 for providing movability of the probe head 15 in three directions (X-, Y- and Z-direction) relative to the base 21. For this reason, the components 22, 23, 24 are moveable relative to each other by drive mechanisms (not shown) linking the three components 22, 23, 24 and the base 21.

An object 6 to be measured is placed on the base 21. For measuring this object 6 the probe head 15 is approached to the surface of the object 6. Coordinates are determined according to a predefined measuring path on which a tactile measuring sensor at the probe head 15 is guided on and the surface profile of the object is determined depending on that measurement.

The machine 2 further comprises a memory unit on which object data is stored. After deriving surface data for the object 6 by measurement, this data is compared to the object data stored in the memory unit and possible variations in the surface are identified on basis of comparing the data.

According to the invention, a model providing at least an actual position and/or a movability of the Z-ram 24 relative to a support 23 for the Z-ram 24 is implemented. For that purpose, the Z-ram 24 is modelled by a set of variable elongated cells, in particular by an additional set of static cells, for digitally representing the Z-ram 24 by a computable model. The support 23 is implemented representing a reference surface relative to which the modelled Z-ram structure 24 is moveable. The modelling is described according to FIGS. 4a-f in more detail.

As to a further embodiment of the invention a coordinate measuring machine providing an execution of the method for providing static and dynamic position information of a designated point of the measuring machine may be in form of a parallel kinematics (e.g. known as Delta Robot or Scara Robot) with at least one linear axis.

According to further embodiments of the invention a model is implemented describing the support 23 by a number of variable cells and particularly static cells, wherein the structural component 22 is implemented representing the reference surface relative to which the support 23 is moveable.

Moreover, referring to further embodiments, the modelling approach according to the invention is applicable to any structural component or combination of components of the CMM 2. E.g. a granite table (base 21) is defined as building the surface and a linear guide (=structure) is modelled with variable and static cells.

Figures 4A, 4B:
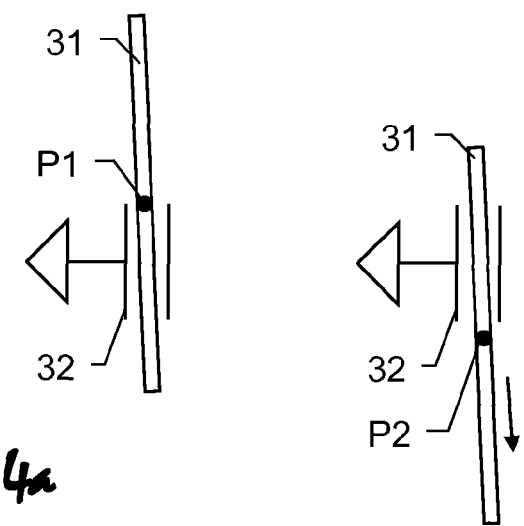
FIGS. 4*a-f* illustrate a relative positioning of a structure and a surface and exemplary embodiments of modelling thereof according to the invention.

FIGS. 4a-illustrate a relative positioning of structure 31 and surface 32 and modelling thereof, wherein FIGS. 4a and 4b show the structure 31 in two different positions P1, P2 relative to the surface 32 and FIGS. 4c to 4f each illustrate a corresponding model.

Figure 4C:
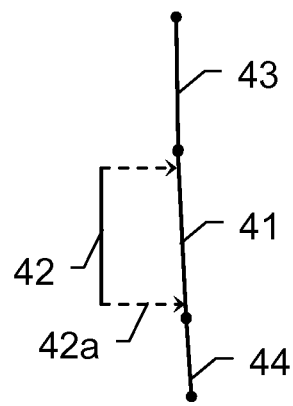
Figure 4D:
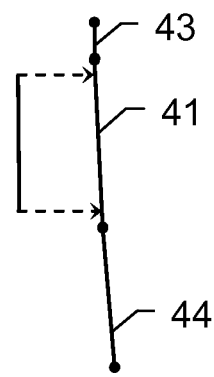

In FIG. 4c a model according to the invention corresponding to the positioning P1 of the structure 31 relative to the surface 32 is shown. An elongated static cell 41 is designed representing a position and orientation of the centre of the structure 31 according to FIG. 4a relative to the surface 32. The surface 32 is represented by an implemented element 42. Furthermore, two variable cells 43,44 are implemented each being connected to the static element and representing an part of the structure 31. The cells 41,43,44 are linearly arranged in a linear extension direction. As the number of elements for modelling a particular position of the structure 31 relative to the surface 32 is quite little and complexity is low with such modelling of the system, reduced computational is required accordingly.

According to a specific embodiment of the invention the implemented surface 32 represents a carriage with at least one bearing, e.g. an air bearing, for guiding a Z-column (which may be represented by the implemented structure 31) of a CMM.

According to the shown embodiment, a coupling (connection) between the structure 31 and the surface 32 is symbolised by the shown arrows 42a.

When changing position of the structure 31 and, thus the position of a designated point of the structure 31, relative to the surface 32 as depicted in FIG. 4b so that the structure 31 is moved along its extension axes (downwards) relative to the surface 32 the model—formerly representing a position P1 for the structure 31—is adapted so that a new position P2 is represented. Such adaptation—according to the invention—is performed by (only) varying the elongation of the variable cells 43 and 44 and keeping further model parameters as set before according to a previous position, especially keeping entire parameters for the static cell 41 constant. Thus, the elongation of cell 43 is varied by "contracting" an upper end of that cell 43 and "extending" a lower end of cell 44 in such a way that the total length over all cells 41, 43, 44 remains constant.

On basis of system modelling according to the invention as set out above calculations of positions (of the designated point) and particularly of errors occurring from vibrations and/or inertias of moving system components is provided faster and with higher accuracy compared to modelling approaches as known from prior art. That is achieved by only using a minimum number of required elements to achieve given accuracy.

With such modelling natural frequencies of the modelled structure 31, e.g. a Z-ram, are considerable. Compared to typical FEM-modelling a significantly reduced number of bodies (cells) is necessary for still matching selected natural frequencies of the structure 31. As a consequence of the reduced number of bodies reduced computing power is required as well. Moreover, according to the outlined modelling, bearing forces do not "move" over borders of finite elements and, thus, fewer elements are required and algorithm complexity is reduced, respectively.

Regarding the number of required modelling elements, some more aspects are to be considered for setting up such model, e.g. the obtainable accuracy is increasing by less than 1/N with the number of elements, whereas the required computing power is increasing by more than $N^2$ with the number of elements.

Therefore, preferably, the smallest possible amount of elements required for representing the number of natural modes while still achieving defined model accuracy is used.

In particular, the number of elements of the variable FEM part (variable cells) is chosen according to the number of natural modes to be represented by the modelling and the desired accuracy. In the example according to FIGS. 4c-d an odd number of elements due to symmetry issues are advantageous. Particularly, in that context, the following equation was found to deliver good modelling results:

$$N=2*n+1,$$

where N is the number of elements (cells, bodies) and n is the number of natural modes to be considered.

Figure 4E:
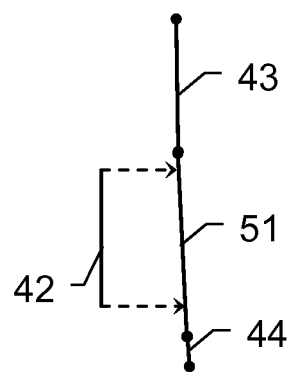

FIG. 4e shows a model according to the invention corresponding to the positioning P1 of the structure 31 (FIG. 4a) relative to the surface 32. An elongated first variable cell 51 is designed representing a position and orientation of the centre of the structure 31 relative to the surface 32. The surface 32 is represented by an implemented element 42. Furthermore, two further variable cells 43, 44 are implemented each being connected to the first variable cell 51 and representing an part of the structure 31. The cells 51, 43, 44 are linearly arranged in a linear extension direction.

Figure 4F:
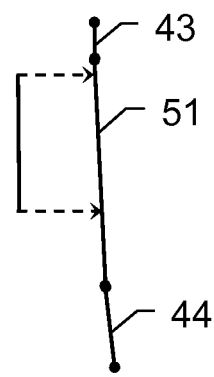

When changing position of the structure 31 according to FIG. 4b the model—formerly representing a position P1 for the structure 31—is adapted so that a new position P2 is represented. According to the invention that adaptation is performed by varying the elongation of at least on of the variable cells 51, 43, 44 or—as shown here in FIG. 4f—by varying the elongation of all variable cells 51, 43, 44. As can be seen in FIG. 4f, cell 43 is shortened while the cells 51 and 44 are extended for representing the position P2 of the structure while keeping the sum of lengths of the cells constant.

Calculations of positions (e.g. of the designated point) and of errors occurring from vibrations and/or inertias of moving components is provided faster and with higher accuracy compared to known modelling approaches. That is enabled by using a limited number of elongated cells.

Solutions where the centre element 41, 51 are divided into more elements lie within the scope of the invention as well. Particularly, the variable centre element 51 or the static centre element can be split into a combination of one or more static elements and/or one or more variable elements. Additionally, the variable elements 43, 44 may also be divided into a combination of one or more static elements and/or one or more variable elements. All these variations lie within the scope of the invention.

Figure 5A:
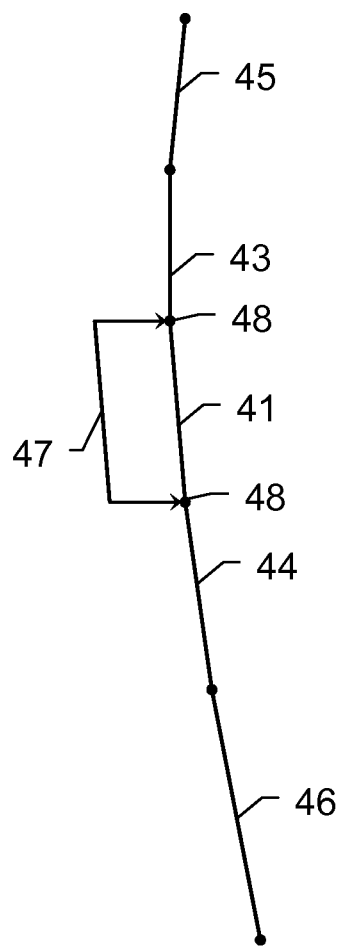
FIGS. 5*a-c* show further embodiments of modelling structures according to the invention.
Figure 5B:
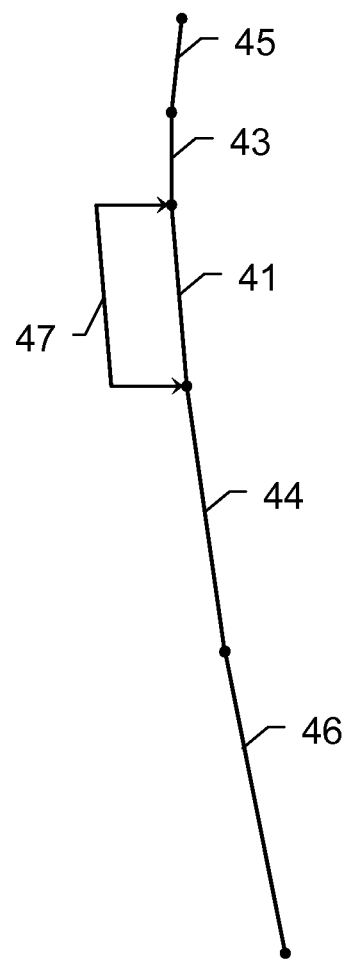

FIGS. 5a-b show a further embodiment of the invention, wherein a structure as for instance shown in FIG. 4a is modelled by five cells, wherein the centre cell 41 is in form of a static cell, i.e. elongation (and e.g. mass and centre of gravity) is constant, being coupled to a reference element 47 which is in fixed position relatively to the structure, and further cells 43-46 are implemented as variable cells with at least changeable elongation as to the extension direction for modelling different positions of a designated point of the structure. The reference element 47 is jointly coupled to joints 48 which are implemented for interconnecting the cell 41 with cells 43, 44 and for providing damping and elastic (springy) properties of the structure.

FIG. 5a depicts a first position of the structure (represented by implemented cells 41, 43-47) relative to a reference element 47 (e.g. a carriage with bearings for holding the structure).

FIG. 5b shows the modelled structure of FIG. 5a in a different position relative to the reference element 47. Here the structure is moved downwards. Such a positional change is modelled according to the present invention by varying the elongation of the variable cells 43-46 along the extension direction. Therefore, with moving the structure downwards the cells 43, 45 are modelled shortened and the cells 44, 46 are modelled stretched in order to represent the new position. The other way (not shown), when modelling a structure according to an upward movement, the cells 43, 45 are modelled in an extended state and the cells 44, 46 are modelled in a contracted state. In both cases the centre cell 41 remains with constant elongation and coupled to the reference element 47 via the joints 48.

Figure 5C:
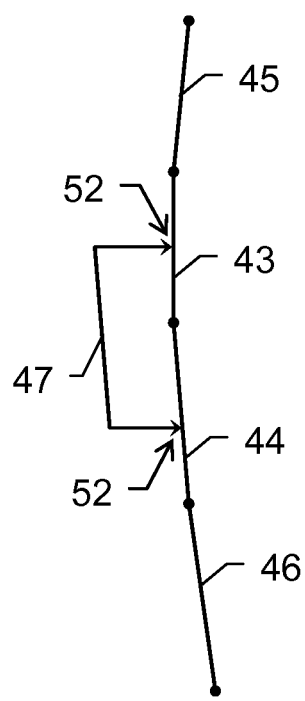

FIG. 5c shows a further embodiment of the invention, wherein the structure as shown in FIG. 4a is modelled by four cells 43-46. These cells 43-46 may either be implemented as variable cells with variable elongation as to their extension direction or as at least one static cell with constant elongation and at least one variable cell.

The cells 43, 44 are coupled to the reference element 47. One or both of these cells can be of variable or static form. If using variable cells 43, 44, a positional change of the structure (FIG. 4a) can be modelled by changing at least the elongation of the two centre cells 43, 44 and, thus, changing the coupling positions 52 between the reference element 47 and the cells 43, 44.

Figure 6:
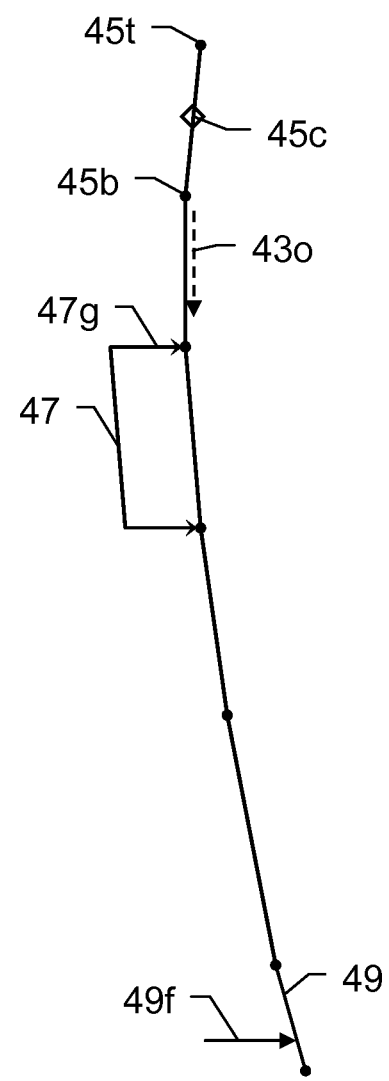
FIG. 6 illustrates a number of state values calculable from a model according to the invention.

FIG. 6 shows the model of a structure according to FIG. 5a, for illustrating a part of the value being calculable with a model according to the invention. Modelling of structures according to the invention (as exemplarily shown in FIGS. 4c-d and 5a-b) enables to calculate a large number of values, which—altogether—represent an actual state of this structure. For instance following values may be calculated:

a top position of the structure (i.e. the upper end point 45t of cell 45),
a top 45t, centre 45c and bottom 45b position (displacement) of each cell (exemplarily shown only for cell 45),
an orientation 43o of each cell (exemplarily shown only for cell 43),
a distortion of cells,
a load force 49f applied by a probe 49, which is connected to the structure and also considered by the model (part of the load force may be due to inertia and accelerations, and part of it may be due to contact force when touching an object. Contact force can be calculated from the probe deflection or could also be measured by a force transducer.) and/or an air gap 47g of an air bearing according to a state of an implemented carriage 47.

By processing such calculated values on their own and/or by allocating defined values to a group (e.g. a centre position group) and processing the values of the group in common, the state of not only a designated point (or single cells) can be described but the state of the whole structure, which is represented by the cells, can be calculated. In context with processing such a group of values e.g. mean values may be calculated or the values may be derived by fitting to a predefined mathematical model for deriving an actual state of the structure.

Although the invention is illustrated above, partly with reference to some specific embodiments, it must be understood that numerous modifications and combinations of different features of the embodiments can be made and that the different features can be combined with modelling principles and/or positioning systems known from prior art.

What is claimed is:

1. A method for providing static and dynamic position information of a designated point of a measuring device, the measuring device comprising:
    a surface; and
    a structure that includes the designated point and the structure is arranged moveable relatively to the surface; and
    a controlling and processing unit adapted for execution of a modelling functionality, on execution of which a model for representing an actual position of a designated point of the structure relative to the surface is defined and the designated point of the structure is derived by a calculation based on the defined model,
    wherein the following steps are carried out by the controlling and processing unit of the measuring device for execution of the method:
        defining the model for representing the actual position of the designated point of the structure relative to the surface of the measuring device;
        deriving the actual position of the designated point by a calculation based on the defined model,
        wherein the model uses at least two cells for modelling the structure, wherein:
            the at least two cells for modelling the structure are linearly arranged in a linear extension direction;
            at least one of the cells for modelling the structure is a variable cell of a set of at least one variable cell; and
            the at least one variable cell exhibits variable elongation as to the extension direction; and
        wherein an actual elongation of the at least one variable cell is set in order to model a positional change of the designated point of the structure in the linear extension direction.

2. The method according to claim 1, wherein:
    the model additionally uses a set of at least one static cell for modelling the structure, wherein:
        at least one of the cells for modelling the structure is a static cell of the set of at least one static cell;
        the at least one static cell and the at least one variable cell are linearly arranged in the linear extension direction; and
        the at least one static cell exhibits substantially constant elongation as to the extension direction.

3. The method according to claim 1, wherein:
at least one of the cells for modelling the structure is implemented as an interconnecting cell for modelling interactions between the designated point of the structure and the surface, wherein the interconnecting cell:
is allocated to the surface; and
remains allocated to the surface when modelling the positional change of the designated point.

4. The method according to claim 1, wherein:
the interconnecting cell is implemented with constant position relative to the surface; and/or
the positional change is modelled by varying the elongation of at least two variable cells.

5. The method according to claim 2, wherein the model uses a first cell, a center cell, and a last cell, wherein:
the center cell belongs to the set of at least one variable cell or to the set of at least one static cell and is implemented for modelling interactions between the surface and the structure; and
the first and the last cell belong to the set of at least one variable cell and the positional change of the designated point is modelled by changing the elongation of the first and the last cell.

6. The method according to claim 3, wherein the model uses a first cell, a center cell, and a last cell, wherein:
the center cell belongs to the set of at least one variable cell or to the set of at least one static cell and is implemented for modelling interactions between the surface and the structure; and
the first and the last cell belong to the set of at least one variable cell and the positional change of the designated point is modelled by changing the elongation of the first and the last cell.

7. The method according to claim 1, wherein:
the model comprising at least two variable cells being linearly arranged as to the linear extension direction; and
the positional change of the designated point is modelled by setting an actual elongation of the at least two variable cells.

8. The method according to claim 1, further comprising:
providing an updated actual position of the designated point by recalculating the position of the designated point with updated elongation parameters of the model, wherein the elongation parameters represent the actual elongation of the at least one variable cell and are updated with changing the elongation, wherein the updated actual position is provided with defined time interval.

9. The method according to claim 1, further comprising:
deriving actual position information for at least a part of the measuring device by calculation based on the model, wherein the actual position information includes a spatial coordinate of a measurement point measurable by a probe connected to the structure.

10. The method according to claim 1, wherein:
cell parameters are defined at least defining one of the following properties of static and/or variable cells for reproducing realistic properties of the structure:
length;
stiffness;
mass;
inertia; and
thermal characteristics.

11. The method according to claim 1, further comprising:
deriving a state parameter indicating a dynamic behavior of the structure and/or of the designated point.

12. The method according to claim 11, wherein:
the state parameter depends on the position of the designated point relative to the surface and/or on a positional change of the designated point and/or of the surface.

13. The method according to claim 12, wherein:
the state parameter defines one of the following values and/or a change of the respective value for the structure and/or the designated point:
actual velocity;
actual acceleration;
currently occurring force;
currently occurring torque; and
currently occurring mechanical stress.

14. The method according to claim 1, further comprising:
deriving an error value representing a displacement and/or deflection of the designated point, wherein:
the displacement and/or deflection is caused by vibration, bending and/or torsion of at least a part of the structure and/or of the surface;
the error value is derived depending on the cell parameters and the state parameter; and
the error value is processed for determining a compensated spatial coordinate of a measurement point.

15. The method according to claim 1, wherein:
connection units are defined for modelling a connection of two neighboring cells; and
the connection units provide damping and/or spring properties.

16. The method according to claim 1, wherein:
the measuring device is formed as at least one of:
a coordinate measuring machine;
a geodetic device that includes at least one of:
a total station;
a theodolite; and
a tachymeter;
a laser tracker; and
a laser rotator.

17. A measuring device comprising:
a structure and a surface, which are arranged movable relatively to each other;
driving means allocated to the structure and the surface for providing movability; and
a controlling and processing unit adapted for execution of a modelling functionality, on execution of which a model for representing an actual position of a designated point of the structure relative to the surface is defined and the designated point of the structure is derived by a calculation based on the defined model, wherein:
the model uses at least two cells for modelling the structure, wherein:
the at least two cells for modelling the structure are linearly arranged in a linear extension direction;
at least one of the cells for modelling the structure is a variable cell of a set of at least one variable cell; and
the at least one variable cell having variable elongation as to the extension direction; and
on execution of the modelling functionality:
an actual elongation of the at least one variable cell is set in order to model a positional change of the designated point in the linear extension direction; and
the actual position of the designated point is calculated based on the model using actual elongation of the at least one variable cell.

18. The measuring device according to claim 17, wherein the measuring device is formed as at least one of:
- a coordinate measuring machine that includes:
  - said structure, which is represented by a first of a number of structural components of the coordinate measuring machine;
  - said surface, which is represented by a second of the number of structural components; and
  - a probe head being movable in three directions being perpendicular to each other, by a machine structure provided by the number of structural components; and
- a geodetic device or a laser tracker that includes:
  - said surface, which is represented by at least a part of a device base, which defines a first axis of rotation, or by at least a part of a support unit defining a second axis of rotation and carrying an aiming unit for directing a laser beam to a target, the support unit being arranged rotatable around the first axis of rotation and the aiming unit being arranged rotatable around the second axis of rotation; and
  - said structure, which is represented by at least a part of the aiming unit or by at least a part of the support unit; and a laser rotator that includes:
  - said surface, which is represented by at least a part of a directing unit for aligning a rotation axis of a deflection unit; and
  - said structure, which is represented by at least a part of the deflection unit.

19. The measuring device according to claim 17, wherein:
the controlling and processing unit is adapted for execution of the method according claim 1.

20. A computer program product having a non-transitory computer-readable medium carrying computer-executable instructions for performing the method of one of claim 1 executed on a controlling and processing unit of a coordinate measuring machine according to claim 17.

21. The method according to claim 1, further comprising driving means allocated to the structure and the surface for providing movability.

* * * * *